United States Patent
Seidel et al.

(10) Patent No.: US 8,227,340 B2
(45) Date of Patent: Jul. 24, 2012

(54) METHOD FOR PRODUCING A COPPER CONNECTION BETWEEN TWO SIDES OF A SUBSTRATE

(75) Inventors: Uwe Seidel, Munich (DE); Thorsten Obernhuber, Regensburg (DE); Albert Birner, Regensburg (DE); Georg Ehrentraut, Villach (AU)

(73) Assignee: Infineon Technologies AG, Neubiberg (DE)

( * ) Notice: Subject to any disclaimer, the term of this patent is extended or adjusted under 35 U.S.C. 154(b) by 40 days.

(21) Appl. No.: 12/433,033

(22) Filed: Apr. 30, 2009

(65) Prior Publication Data

US 2010/0279503 A1    Nov. 4, 2010

(51) Int. Cl.
*H01L 21/4763* (2006.01)
*H01L 21/44* (2006.01)
*H01L 21/461* (2006.01)

(52) U.S. Cl. ........ 438/643; 438/648; 438/653; 438/656; 438/669; 438/685; 438/687; 438/712; 257/E23.011

(58) Field of Classification Search .................. 438/643, 438/648, 653, 656, 669, 685, 687, 712; 257/E23.011
See application file for complete search history.

(56) References Cited

U.S. PATENT DOCUMENTS

| | | | |
|---|---|---|---|
| 2003/0032281 A1* | 2/2003 | Werkhoven et al. | 438/640 |
| 2005/0153546 A1 | 7/2005 | Ahrens et al. | |
| 2007/0004190 A1* | 1/2007 | Dambrauskas et al. | 438/613 |
| 2007/0178694 A1* | 8/2007 | Hiatt | 438/667 |
| 2007/0205520 A1* | 9/2007 | Chou et al. | 257/780 |
| 2007/0267297 A1* | 11/2007 | Akolkar et al. | 205/118 |
| 2008/0079121 A1 | 4/2008 | Han | |
| 2008/0111213 A1* | 5/2008 | Akram et al. | 257/621 |
| 2008/0303154 A1 | 12/2008 | Huang et al. | |
| 2008/0303163 A1 | 12/2008 | Liu et al. | |
| 2009/0280643 A1* | 11/2009 | Andry et al. | 438/656 |
| 2009/0315154 A1* | 12/2009 | Kirby et al. | 257/621 |

FOREIGN PATENT DOCUMENTS

| DE | 43 19 089 A1 | 12/1994 |
|---|---|---|
| EP | 1 553 625 A1 | 7/2005 |

* cited by examiner

*Primary Examiner* — Kevin Parendo
(74) *Attorney, Agent, or Firm* — Slater & Matsil, L.L.P.

(57) ABSTRACT

A method for producing an electrically conductive connection between a first surface of a semiconductor substrate and a second surface of the semiconductor substrate includes producing a hole, forming an electrically conductive layer that includes tungsten, removing the electrically conductive layer from the first surface of the semiconductor substrate, filling the hole with copper and thinning the semiconductor substrate. The hole is produced from the first surface of the semiconductor substrate into the semiconductor substrate. The electrically conductive layer is removed from the first surface of the semiconductor substrate, wherein the electrically conductive layer remains at least with reduced thickness in the hole. The semiconductor substrate is thinned starting from a surface, which is an opposite surface of the first surface of the semiconductor substrate, to obtain the second surface of the semiconductor substrate with the hole being uncovered at the second surface of the semiconductor substrate.

19 Claims, 3 Drawing Sheets

METHOD FOR PRODUCING A COPPER CONNECTION BETWEEN TWO SIDES OF A SUBSTRATE

TECHNICAL FIELD

Embodiments of the invention relate to a production of electrically conductive connections between two sides of a substrate, more particularly, to a method for producing an electrically conductive connection between a first surface of a semiconductor substrate and a second surface of a semiconductor substrate.

BACKGROUND

A reliable production of such electrical connections, which are also called through-silicon-vias if silicon is used as substrate, are of high interest for the semiconductor industry.

BRIEF DESCRIPTION OF THE DRAWINGS

Embodiments according to the invention will be explained in greater detail in the following with reference to the accompanying figures, in which.

DETAILED DESCRIPTION OF ILLUSTRATIVE EMBODIMENTS

Figure 1:
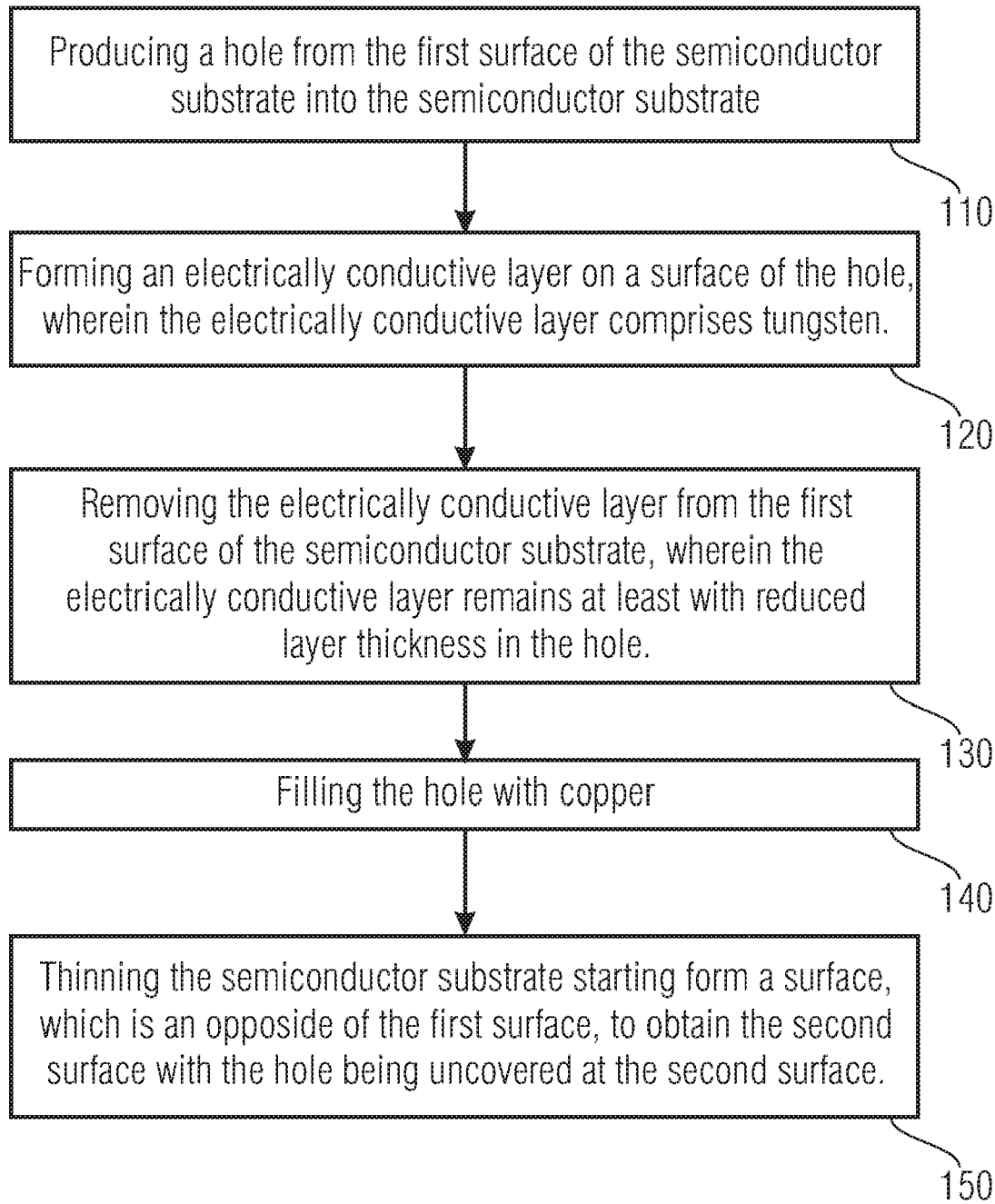
FIG. 1 is a flow chart of a method for producing an electrically conductive connection between a first surface of a semiconductor substrate and a second surface of the semiconductor substrate.

In the following, the same reference numerals are partly used for objects and functional units having the same or similar functional properties and the description thereof with regard to a figure shall apply also to other figures in order to reduce redundancy in the description of the embodiments.

FIG. 1 shows a flow chart of a method 100 for producing an electrically conductive connection between a first surface of a semiconductor substrate and a second surface of the semiconductor substrate according to an embodiment of the invention. The method 100 comprises producing 110 a hole, forming 120 an electrically conductive layer, removing 130 the electrically conductive layer from the first surface, filling 140 the hole with copper and thinning 150 the semiconductor substrate.

The hole is produced 110 from the first surface of the semiconductor substrate into the semiconductor substrate and the electrically conductive layer is formed 120 on the surface of the hole, wherein the electrically conductive layer comprises tungsten. Then, the electrically conductive layer is removed 130 from the first surface of the semiconductor substrate, wherein the electrically conductive layer remains at least with reduced layer thickness in the hole. The semiconductor substrate is thinned 150 starting from a surface, which is an opposite surface of the first surface, to obtain the second surface with the hole being uncovered at the second surface.

Removing 130 the electrically conductive layer before filling the hole with copper may avoid problems with adhesion or corrosion of the copper filling. This may happen, because a slurry used for the removal of the tungsten from the first surface of the semiconductor substrate may attack the copper filling by an electrochemical process. Therefore, the described method removes 130 the electrically conductive layer before filling the hole with copper.

Avoiding adhesion and/or corrosion problems of the copper filling may increase the reliability of the manufacturing of the electrically conductive connections significantly.

The hole may be filled with copper by a direct plating process directly on the electrically conductive layer or on an optional barrier layer formed on top of the electrically conductive layer. Alternatively, a further electrically conductive layer may be formed on top of the electrically conductive tungsten layer, wherein the further electrically conductive layer is used as a seed layer for the copper filling.

The electrically conductive layer may be removed by a wet chemical or dry chemical step or a combination of them. For example, reactive ion etching (RIE) may be performed to remove the electrically conductive layer from the surface of the semiconductor substrate. The RIE process may be adjusted, so that the electrically conductive layer may remain at the side walls and the bottom of the hole at least with reduced thickness.

The thinning of the semiconductor substrate may be done by back grinding or back grinding in connection with following dry or wet etching and/or in connection with CMP (chemical mechanical polishing). The tungsten of the electrically conductive layer may be used as an etch stop during the thinning of the substrate.

Figure 2:
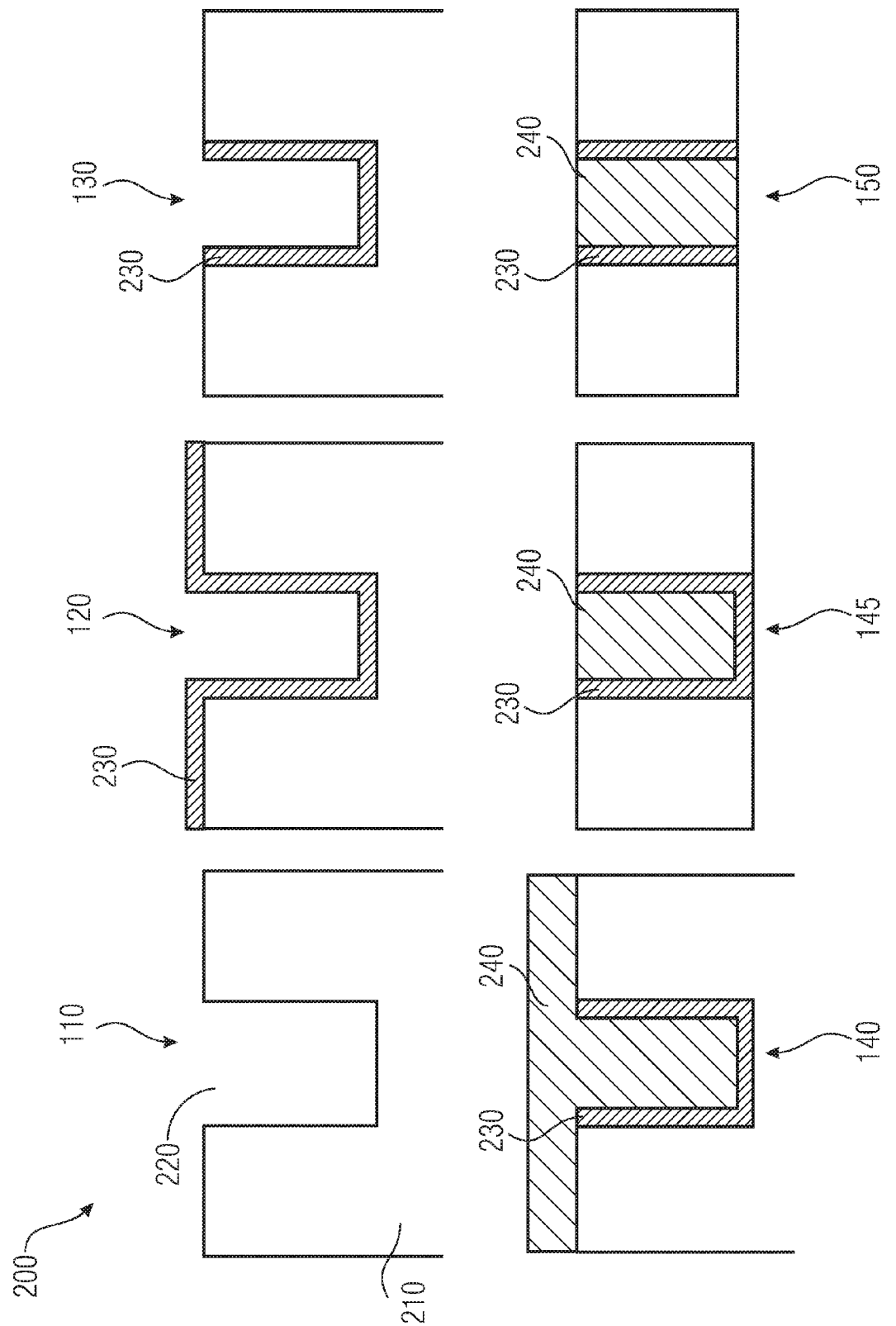
FIG. 2 is a schematic illustration of a process flow of a method for producing an electrically conductive connection between a first surface of a semiconductor substrate and a second surface of the semiconductor substrate.

Corresponding to FIG. 1, FIG. 2 shows a schematic illustration of a process flow 200 of a method for providing an electrically conductive connection between a first surface of a semiconductor substrate and a second surface of a semiconductor substrate according to an embodiment of the invention.

First, the hole 220 is produced 110 into the semiconductor substrate 210. Then, the electrically conductive layer 230 is formed 120 on the surface of the hole. Next, the electrically conductive layer 230 is removed 130 from the first surface of the semiconductor substrate 210. The electrically conductive layer 230 remains, at least with reduced thickness, in the hole 220. At least with reduced thickness means that the electrically conductive layer 230 inside the hole 220 (at the bottom and the side walls of the hole) may (or may not) be thinned during the removal of the electrically conductive layer 230 from the first surface of the semiconductor substrate 210. It may be possible to remove 130 the electrically conductive layer 230 from the first surface of the semiconductor substrate 210 without reducing the thickness of the electrically conductive layer 230 inside the hole 220. For example, the electrically conductive layer 230 may be removed by dry chemical or wet chemical etching. During this process, the hole 220 may be sealed by a lacquer, for example. If the hole 220 is sealed, the thickness of the electrically conductive layer 230 inside the hole 220 may not be reduced. After removing 130 the electrically conductive layer 230, the remaining hole 220 is filled 140 with copper 240 and finally the semiconductor substrate 210 is thinned 145 until the electrically conductive layer 230 is uncovered or excavated and the second surface is obtained. Optionally, the thinning can be continued 150 to uncover the copper 240.

The substrate 210 may be, for example, a silicon wafer, a silicon on insulator (SOI) wafer, a gallium arsenide wafer (GaAs) or another substrate used in the semiconductor industry. The electrically conductive layer 230 may be, for example, completely made up of tungsten or tungsten nitride. The copper filling 240 may comprise portions of other elements for adapting the material properties of the filling material, but more than 50%, more than 90% or more than 99% of the filling material may be copper.

Optionally, after processing the hole 220 into the substrate 210, a barrier layer at the surface of the hole 220 may be formed, which may be used as diffusion barrier for the tungsten comprised by the electrically conductive layer 230. A surface of the barrier layer may then be the new surface of the hole 220, on which the electrically conductive layer 230 is formed. The barrier layer may comprise a titanium layer and/or a titanium nitride layer.

Also optionally, after processing the hole 220 into the substrate 210, an electrically isolating layer at the surface of the hole 220 may be formed. A surface of the electrically isolating layer may then be the new surface of the hole 220, on which the electrically conductive layer 230 or the optional barrier layer may be formed. The electrically isolating layer may be formed, for example, by oxidation of the semiconductor substrate 210 or by depositing silicon dioxide.

Figure 3:
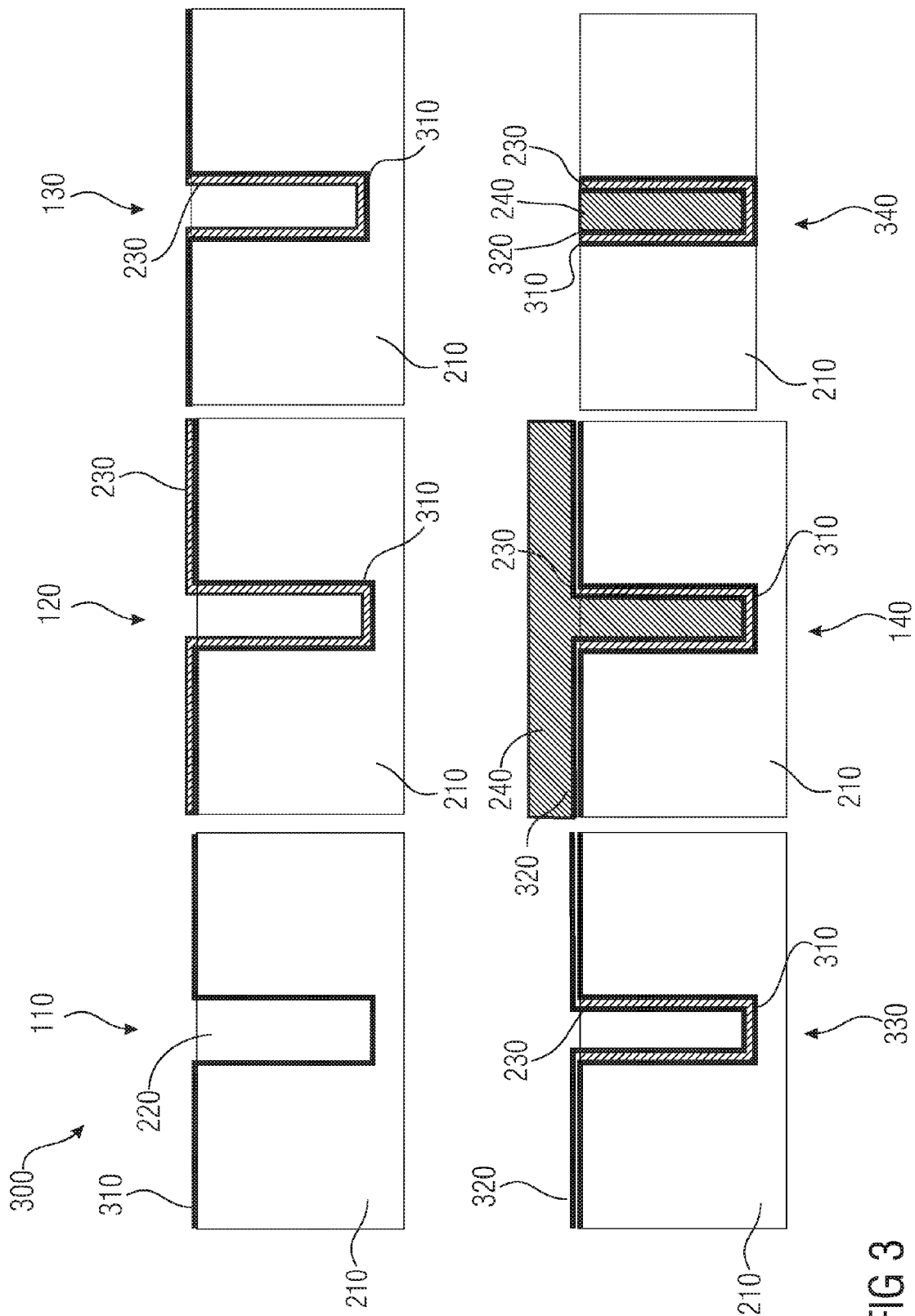
FIG. 3 is a schematic illustration of a process flow of a method for producing an electrically conductive connection between a first surface of a semiconductor substrate and a second surface of the semiconductor substrate.

FIG. 3 shows a schematic illustration of a process flow 300 of a method for producing an electrically conductive connection between a first surface of a semiconductor substrate and a second surface of a semiconductor substrate according to an embodiment of the invention.

First, a deep hole 220, which is also called a via, with a high aspect ratio is etched 110 for utilization or realization of an electrically conductive connection through the substrate 210, which is also called through-silicon-via, if silicon is used as substrate. In this example, tungsten is used as an electrically conductive layer 230 and therefore a tungsten (W) barrier 310 is deposited into the through-silicon-via. Then, the tungsten layer as electrically conductive layer 230 is deposited 120 in order to support the following copper-seed-layer 320, which may be deposited by PVD (physical vapor deposition), and in order to enable a repair of the PVD-seed-layer 320. The tungsten layer 230 may be used as a barrier in the via and may be deposited, for example, on top of a PVD-titanium-nitride or CVD titanium-nitride barrier 310 (CVD: chemical vapor deposition). The tungsten layer is then removed from the surface (of the substrate), for example, by an RIE (reactive ion etching)-etch 130 (WEB: tungsten etch back).

A sufficiently thick tungsten layer 230 remains in the via (the hole). The titanium nitride 310 (the barrier layer) may also be removed by RIE or wet-etch. A sufficiently thick tungsten layer, which is the electrically conductive layer with reduced thickness, may be thicker than 10, 50 or 100 nanometers, for example, 80, 100, 150, 200, 300 nanometers or even thicker. The tungsten etch back method (WEB) may be used instead of a CMP (chemical mechanical polishing) process for a hole layer stack on the surface of the semiconductor substrate at the end. Therefore, as mentioned before, adhesion and/or corrosion problems of the copper filling of the hole may be avoided.

A copper barrier 320 (a further electrically conductive layer) is then deposited 330 into the through-silicon-via. For example, a PVD-tantalum nitride/tantalum/copper layer (only tantalum/copper or tantalum/tantalum nitride/copper may also be possible; copper deposited out of the gas phase may be also possible) may be deposited on the wafer surface (on the surface of the semiconductor substrate) and into the via (into the hole). This is followed by a deposition 140 of a copper layer 240 (the filling material), which may be done, for example, by an electrolytical deposition. Afterwards, the removal 340 of the layer stack, which is for this example titanium/titanium nitride/tantalum/tantalum nitride copper (Ti/TiN/Ta/TaN/Cu), from the wafer surface may be done by a CMP-method, a wet-etching method or a dry-etching method or a combination of these. The thinning of the substrate 210 from the back side (which is the opposite side of the first surface of the substrate) is not shown in this example.

The tungsten layer or electrically conductive layer may also be called a first electrically conductive layer and the copper barrier or further electrically conductive layer may also be called a second electrically conductive layer.

Filling the hole, for example, involves filling the remaining hole after forming the described layers as shown in FIG. 3.

The material of the barrier layer may be matched to the material of the electrically conductive layer 230. For example, the barrier layer may be a titanium layer (Ti) or a titanium nitride layer (TiN) or a combination of a titanium layer and a titanium nitride layer (Ti/TiN).

The further electrically conductive layer may be used as a seed layer for the copper filling 240. Therefore, the further electrically conductive layer 320 could comprise, for example, at least partly the same material as the filling material 240. Since copper is used as the filling material 240, the further electrically conductive layer 320 may be made up of copper as well, or may comprise a multi-layer comprising a tantalum sub-layer (Ta) and a copper sub-layer or may comprise a multi-layer comprising a tantalum sub-layer (Ta), a tantalum nitride sub-layer (TaN) and a copper sub-layer. Alternatively, instead of tantalum or tantalum nitride, tungsten nitride may be used. The barrier layer 310 and/or the further electrically conductive layer 320 may comprise an average thickness thinner than an average thickness of the electrically conductive layer comprising tungsten.

By using an electrically conductive layer with a good edge covering property, a continuously conductive layer may be realized. The edge covering property of a material is especially important at high topography as, for example, existing at a hole. In this way, the requirements posed on the further electrically conductive layer, which is used as a seed layer for the filling material, may be reduced and the reliability of the manufacturing of the electrically conductive connection may be significantly improved.

The edge covering property may be related to a probability to obtain an uninterrupted layer, if a surface with topography should be covered by the layer. The higher the probability for obtaining an uninterrupted layer, the better the edge covering property of a material.

For example in FIG. 3, the tungsten (W) layer comprises an excellent edge covering property and the further electrically conductive layer (for example Ta/Tan or Tan/Ta barrier and/or copper seed layer) comprise a less excellent edge covering property, but may be used as a seed layer for the filling material.

Some embodiments according to the invention relate to a method for producing an electrically conductive connection between the first surface of a silicon substrate and the second surface of a silicon substrate. The method comprises producing a hole, forming a barrier layer, forming a first electrically conductive layer, removing the first electrically conductive layer from the first surface of the silicon substrate, forming a second electrically conductive layer, filling the hole and thinning the silicon substrate.

The hole is produced from the first surface of the silicon substrate into the silicon substrate. The barrier layer is formed on the surface of the hole and comprises a titanium layer, a titanium nitride layer or a combination of a titanium layer and a titanium nitride layer. The first electrically conductive layer is formed on top of the barrier layer and is made up of tungsten or tungsten nitride. Then, the first electrically conductive layer is removed from the first surface of the silicon substrate, wherein the first electrically conductive layer remains at least with reduced thickness in the hole. The second electrically conductive layer is formed on top of the first electrically conductive layer and is made up of copper or comprises a copper layer and a tantalum layer or comprises a copper layer, a tantalum layer and a tantalum nitride layer. The hole is filled with copper, wherein the second electrically conductive layer is used as a seed layer for the copper filling. Then, the silicon substrate is thinned starting from a surface, which is an opposite surface of the first surface of the silicon substrate, to obtain the second surface of the silicon substrate with the hole being uncovered at the second surface of the silicon substrate.

The electrically conductive connection may also be called a through-silicon-via.

Thus, in other words, the above embodiments also relate to a method for production of at least one metallic connect-through-contact in silicon components or in other words, a production of metallic connect-through-contacts from a front side of a silicon wafer to a back side. For example, after completion of all active elements (for example, implants for transistors, diodes, wells) before the first metal layer (for the wiring, for example, of the active elements) is manufactured, a process module, which may be called a "substrate-via", may be inserted. This may consist in the first step of etching a via into the silicon until a predefined depth is reached. If necessary, a dielectric isolation layer may be formed at the surface of the hole (via). The hole may be filled by a galvanic copper deposition. Similar to the copper damascene process, the unneeded copper layer on top of the plane surface may then be removed by a standard copper-CMP (chemical mechanical polishing). After finishing all front side processes, silicon is removed from the back side, for example, first by grinding and then wet-chemical (for example, damage etch). The ends of the metallic filled vias may be uncovered from the back side and may be planed by a planing process, for example, CMP (chemical mechanical polishing), afterwards or the silicon may only be thinned, so that the wires stay covered by the silicon and afterwards being planed by a planing process, which removes silicon. Finally, a back side metallization may be deposited on top of the polished and planed vias.

In even other words, the above embodiments showed a tungsten layer, which is deposited into the substrate-via (the hole), for example, by a CVD (chemical vapor deposition) -process. This layer may solve several problems. The tungsten layer comprises an excellent edge covering and may serve as a current supply for the galvanic. The demands for a necessary copper-seed-layer may be reduced dramatically in this way. The seed layer may be deposited by a PVD method (physical vapor deposition) and an expensive CVD (chemical vapor deposition) method may not be necessary. After a deposition on the surface, the tungsten layer may be removed by an RIE-etch only from the surface. A sufficiently thick tungsten layer may remain in the via. The surface of the via is covered with tungsten, wherein the tungsten is not removed from the bottom of the via during the etch back, so that a sufficient barrier may be formed. An expensive back side photo technique (at thin wafers), for example, lithography, may not be necessary. During a damage-etch at the back side, the titanium/titanium nitride/tungsten stack may serve as an etch stop.

The tungsten layer in the substrate-via may be realized, so that the copper-CMP step performed after the via filling shows no adhesion or corrosion phenomenon in combination with the used barrier layer stack.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

Although some claims only relate to one other claim, also a combination with further claims may be possible.

What is claimed is:

1. A method for producing an electrically conductive connection between a first surface of a semiconductor substrate and a second surface of the semiconductor substrate, the method comprising:
   producing a hole from the first surface of the semiconductor substrate into the semiconductor substrate;
   forming an electrically conductive layer on the first surface of the semiconductor substrate, a side wall surface of the hole and a bottom surface of the hole, wherein the electrically conductive layer comprises tungsten;
   removing the electrically conductive layer from the first surface of the semiconductor substrate, wherein the electrically conductive layer remains, at least with reduced thickness, at the bottom surface and the side wall surface of the hole, wherein the removing of the electrically conductive layer from the first surface of the semiconductor substrate comprises performing a reactive ion etch process that is adjusted so that the electrically conductive layer remains at the bottom surface and the side wall surface of the hole;
   filling the hole with copper after removing the conductive layer from the first surface of the semiconductor substrate, wherein the copper is separated from the bottom surface and the side wall surface of the hole by at least the electrically conductive layer; and
   thinning the semiconductor substrate starting from a surface, which is an opposite surface of the first surface of the semiconductor substrate, to obtain the second surface of the semiconductor substrate with the electrically conductive layer being uncovered at the second surface of the semiconductor substrate.

2. The method according to claim 1, further comprising forming a barrier layer on the side wall surface and the bottom surface of the hole, wherein the barrier layer is formed before the electrically conductive layer is formed, and wherein the barrier layer is used as a diffusion barrier for the tungsten of the electrically conductive layer.

3. The method according to claim 2, wherein the barrier layer comprises an average thickness that is thinner than an average thickness of the electrically conductive layer.

4. The method according to claim 2, wherein the barrier layer comprises titanium or titanium nitride.

5. The method according to claim 4, wherein the barrier layer comprises a multi-layer comprising a titanium sub-layer and a titanium nitride sub-layer.

6. The method according to claim 1, further comprising forming an electrically insulating layer at the surface of the hole, wherein the electrically insulating layer is formed before the electrically conductive layer is formed.

7. The method according to claim 1, further comprising forming a second electrically conductive layer over the remaining electrically conductive layer, wherein the second electrically conductive layer is used as a seed layer for the copper filling.

8. The method according to claim 7, wherein the second electrically conductive layer comprises an average thickness that is thinner than an average thickness of the electrically conductive layer.

9. The method according to claim 7, wherein the second electrically conductive layer comprises copper.

10. The method according to claim 9, wherein the second electrically conductive layer comprises a multi-layer comprising a copper sub-layer and a tantalum sub-layer.

11. The method according to claim 10, wherein the second electrically conductive layer comprises a multi-layer comprising a copper sub-layer, a tantalum sub-layer and a tantalum nitride sub-layer.

12. The method according to claim 1, wherein the electrically conductive layer comprises tungsten nitride.

13. The method according to claim 1, wherein the thinning of the semiconductor substrate comprises back grinding the semiconductor substrate from the opposite surface, of the first surface of the semiconductor substrate to obtain the second surface of the semiconductor substrate with the hole being uncovered.

14. The method according to claim 1, wherein the thinning of the semiconductor substrate comprises back grinding the semiconductor substrate from the surface, which is the opposite surface of the first surface of the semiconductor substrate, followed by wet chemical or dry chemical etching to obtain the second surface of the semiconductor substrate with the hole being uncovered.

15. The method according to claim 14, wherein the electrically conductive layer comprising tungsten is used as an etch stop for the thinning.

16. The method according to claim 1, wherein the thinning of the semiconductor substrate comprises removing the electrically conductive layer to expose the copper.

17. A method for producing an electrically conductive connection between a first surface of a silicon substrate and a second surface of the silicon substrate, the method comprising:

producing a hole from the first surface of the silicon substrate into the silicon substrate;

forming a barrier layer on a surface of the hole, wherein the barrier layer comprises a titanium layer, a titanium nitride layer or a combination of the titanium layer and the titanium nitride layer;

forming a first electrically conductive layer on top of the barrier layer, wherein the first electrically conductive layer comprises tungsten or tungsten nitride;

removing the first electrically conductive layer from the first surface of the silicon substrate, wherein the first electrically conductive layer remains, at least with reduced thickness, in the hole, wherein the removing of the first electrically conductive layer from the first surface of the silicon substrate comprises performing a reactive ion etch process that is adjusted so that the first electrically conductive layer remains at a bottom surface and a side wall surface of the hole;

forming a second electrically conductive layer over the first electrically conductive layer, wherein the second electrically conductive layer comprises copper;

filling the hole with copper after removing the first conductive layer from the first surface of the silicon substrate, wherein the second electrically conductive layer is used as a seed layer when filling the hole with copper; and thinning the silicon substrate starting from a surface, which is an opposite surface of the first surface of the silicon substrate, to obtain the second surface of the silicon substrate with the first electrically conductive layer being uncovered at the second surface of the silicon substrate.

18. The method according to claim 17, wherein the second electrically conductive layer comprises a copper layer and a tantalum layer.

19. The method according to claim 18, wherein the second electrically conductive layer comprises the copper layer, the tantalum layer and a tantalum nitride layer.

* * * * *